US007232489B2

(12) United States Patent
Webb

(10) Patent No.: US 7,232,489 B2
(45) Date of Patent: Jun. 19, 2007

(54) CRUCIBLE OR RELATED OBJECT HOLDER AND METHOD OF MANUFACTURE

(76) Inventor: Olivia Webb, 636 E. Tripp Rd., Sunnyvale, TX (US) 75182

( * ) Notice: Subject to any disclaimer, the term of this patent is extended or adjusted under 35 U.S.C. 154(b) by 103 days.

(21) Appl. No.: 11/180,162

(22) Filed: Jul. 13, 2005

(65) Prior Publication Data

US 2007/0012243 A1 Jan. 18, 2007

(51) Int. Cl.
*C30B 35/00* (2006.01)

(52) U.S. Cl. ....................... 117/218; 117/208; 117/217; 117/222; 117/911

(58) Field of Classification Search ................ 117/208, 117/217, 218, 222, 911
See application file for complete search history.

(56) References Cited

U.S. PATENT DOCUMENTS 232,977 A 10/1880 Judson
653,587 A 7/1900 Newell
1,226,653 A 1/1917 Goldberg
1,441,340 A 1/1923 Goldberg
2,528,536 A 11/1950 Meyrowitz
4,238,450 A * 12/1980 Bredeweg et al. ............ 422/63
6,228,167 B1 * 5/2001 Kuramoto et al. .......... 117/208

* cited by examiner

*Primary Examiner*—Felisa Hiteshew
(74) *Attorney, Agent, or Firm*—Jackson Walker L.L.P.; Christopher J. Rourk

(57) ABSTRACT

An apparatus for holding a crucible or other item is provided. The apparatus includes a first support member having a straight portion with two ends. A second support member having a shaped portion is connected to one of the ends of the first support member, wherein the shape of the shaped portion accommodates the crucible or other item. A support material covers the second support member, wherein the support material increases the coefficient of friction between the crucible or other item and the second support member. A spring is coupled to the other end of the first support member, and a third support member is coupled to the spring and configured so as to apply a force to the crucible or other item when the crucible or other item is placed in the shaped portion of the second support member. The third support member can be moved by exerting a force opposite to that applied by the spring so as to allow the crucible or other item to be placed in the shaped portion of the second support member, and when the exerted force is removed, the third support member is placed in contact with the crucible or other item by the spring force, such as to hold the crucible without exceeding the amount of force that would break the crucible or other item.

10 Claims, 2 Drawing Sheets

CRUCIBLE OR RELATED OBJECT HOLDER AND METHOD OF MANUFACTURE

FIELD OF THE INVENTION

The present invention relates to an apparatus used to hold a crucible or other objects that may be in a state of extreme heat or cold, may be radioactive, or may otherwise require separation between a human actor that is manipulating the object and the object.

BACKGROUND

Apparatuses for holding objects in a laboratory or manufacturing environment are known in the art. Such apparatuses usually rely on a tong-like configuration to allow a user to place enough pressure on the object through the use of two opposing and moveable supports to provide sufficient clamping force without causing the object to be broken by the clamping force.

Although some spring-loaded configurations for apparatuses for holding objects are known, such spring-loaded configurations suffer from various drawbacks. For example, it is often necessary to limit the spring force to prevent breakage of the object, which is typically made of ceramic or glass. As a result, objects may slip out of such spring-loaded apparatuses.

SUMMARY OF THE INVENTION

In accordance with the present invention, an apparatus for holding a crucible or other object is provided that overcomes known problems with inspection lighting heads.

In particular, an apparatus for holding a crucible or other object and method of use are provided that allows a crucible or other object to be held without risk of breakage or slippage.

In accordance with an exemplary embodiment of the present invention, an apparatus for holding a crucible or other item is provided. The apparatus includes a first support member having a straight portion with two ends. A second support member having a shaped portion is connected to one of the ends of the first support member, wherein the shape of the shaped portion accommodates the crucible or other item. A support material covers the second support member, wherein the support material increases the coefficient of friction between the crucible or other item and the second support member. A spring is coupled to the other end of the first support member, and a third support member is coupled to the spring and configured so as to apply a force to the crucible or other item when the crucible or other item is placed in the shaped portion of the second support member. The third support member can be moved by exerting a force opposite to that applied by the spring so as to allow the crucible or other item to be placed in the shaped portion of the second support member, and when the exerted force is removed, the third support member is placed in contact with the crucible or other item by the spring force, such as to hold the crucible without exceeding the amount of force that would break the crucible or other item.

The present invention provides many important technical advantages. One important technical advantage of the present invention is an apparatus for holding a crucible or other item that allows an increases spring force to be applied to the crucible or other item by virtue of the shaped portion and support material, which distribute the force to prevent breakage and increase the holding force applied to the crucible or other item so as to prevent slippage.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
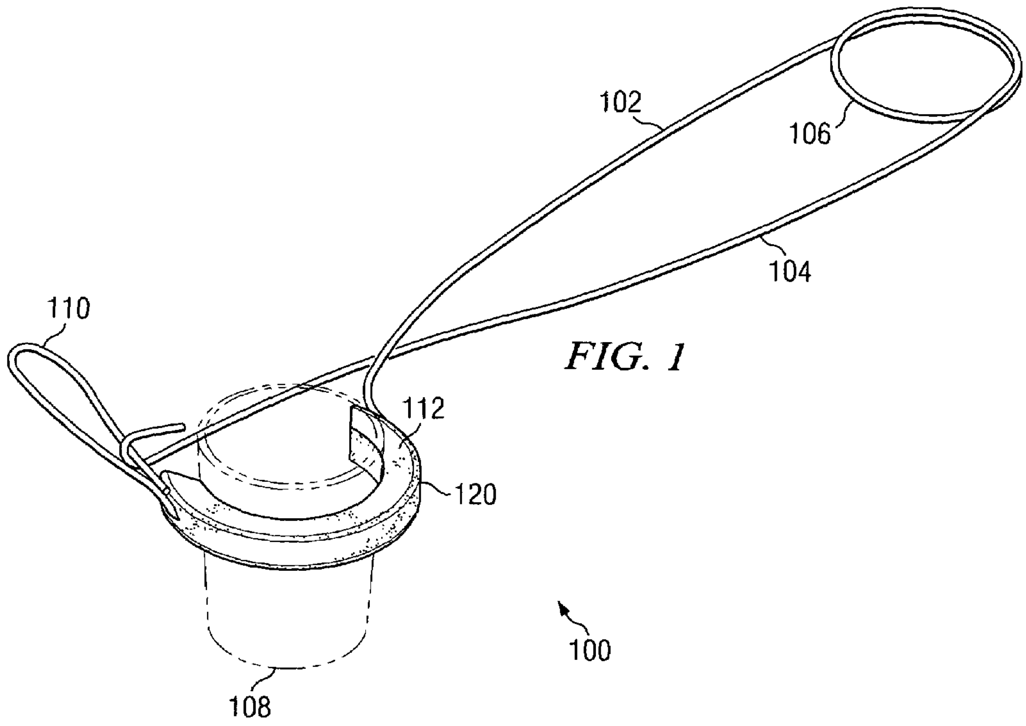
FIG. 1 is a diagram of an apparatus for holding a crucible or other item in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of an apparatus 100 for holding a crucible or other item in accordance with an exemplary embodiment of the present invention. Apparatus 100 includes a first support member 102 having a relatively straight portion with two ends. The first support member 102 can be formed of metal wire, a polymer, or other suitable materials to provide a rigid support structure. A second support member 112 is also provided, having a shaped portion coupled to one of the ends of first support member 102. As used herein, the term "coupled" and its cognate terms such as "couple" and "couples," can include a connection to a structure formed from a continuous material, such as an extruded metal wire or structure, an extruded polymer material, an injection molded structure having separate members, a connection formed by gluing, welding, riveting, stapling, stamping, or other suitable connections.

The shaped portion of second support member 112 is selected to accommodate the crucible 108 or other item. In one exemplary embodiment, the shaped portion of second support member 112 can be fixed for predetermined structures, such as crucibles 108 having predetermined dimensions, test tubes or other laboratory glassware, or other suitable items. In another exemplary embodiment, the shaped portion of second support member 112 can be modified by the user to fit a user-selected item, such as by bending or otherwise modifying the material of second support member 112, by selecting one of two or more pre-selected settings of the shaped portion of second support member 112, by disconnecting the shaped portion of second support member 112 from the first support member 102 and replacing the shaped portion with a different shaped portion of second support member 112, or in other suitable manners. In this manner, the shaped portion of second support member 112 can be provided so as to increase the contact area between crucible 108 or other item and second support member 112.

Support material 120 can cover the shaped portion of second support member 112. Support material 120 increases the coefficient of friction between crucible 108 or other items and the shaped portion of second support member 112, and can also provide a cushioning force between the shaped portion of second support member 112 and crucible 108 or other item. In one exemplary embodiment, support material 120 can be comprised of a foam rubber, a solid polymer, or other material having a coefficient of compression that allows a greater force to be applied to crucible 108 or other item so as to reduce the risk of breakage while increasing the holding force to decrease the risk of crucible 108 or other item from slipping from apparatus 100.

A spring 106 coupled to the other end of the first support member 102 applies a force to first support member 102 and a third support member 104 that causes them to move towards each other. Guide 110 can be used to restrict the motion of third support member 104 along a path away from and towards second support member 112. In one exemplary embodiment, guide 110 can restrict the maximum inward location of third support member 104 so as to prevent the spring force from spring 106 from exceeding the material strength of crucible 108 or other items, so as to prevent them from being broken. The force applied by spring 106 can also be coordinated with the coefficient of compression of support material 120 and the material strength of the crucible 108 or other item so as to allow a force sufficient to prevent slippage to be applied while ensuring that the force does not cause crucible 108 or the other item to break.

Third support member 104 is coupled to spring 106 and is configured so as to apply a force to crucible 108 or other item when crucible 108 or other item is placed in the shaped portion of second support member 112, wherein third support member 104 can be moved by exerting a force opposite to that applied by spring 106 so as to allow crucible 108 or other items to be placed in the shaped portion of second support member 112.

In one exemplary embodiment, support material 120 is a foam rubber, a heat-resistant polymer, a ceramic material, a metal having surface treatment or texturing, non-stick materials (such as when crucible 108 or other items are sticky or have inherent adhesive qualities), or other suitable materials.

Guide 110 is coupled to second support member 112, wherein third support member 104 is coupled to guide 110 so as to limit the range of motion of third support member 104. In one exemplary embodiment, third support member 104 is looped around a section of guide 110, where the range of motion of third support member 104 is restricted by the range of motion permitted by the section of guide 110 that third support member 104 is looped around. Likewise, other suitable configurations can be used.

Although not explicitly shown in the figures, support material 120 can also be applied to third support member 104 in addition to the shaped portion of second support member 112, so as to allow additional support to be applied to crucible 108 or other items being held by apparatus 100. Likewise, support material 120 can extend beyond those areas where third support member 104 contacts crucible 108 or any other item.

An exemplary method for handling a crucible or other item, such as by using apparatus 100 or other suitable apparatuses, includes applying a force to third support member 104 to counteract spring force from spring 106, so as to cause third support member 104 to move in a first direction away from first support member 102. The shaped portion of second support member 112 is then placed in contact through support material 120 with crucible 108 or other suitable items. The force is then removed from third support member 104 so as to allow the spring force to move third support member 104 in a direction opposite to the first direction, so as to apply the force from spring 106 to crucible 108 or other items. The spring force from spring 106 is selected so as to prevent crucible 108 or other items from being damaged by the third support member 104, and also to prevent slippage. In addition, the shaped portion of the second support member 112 and the support material 120 can be modified to match the shape of crucible 108 or other item.

Figure 2:
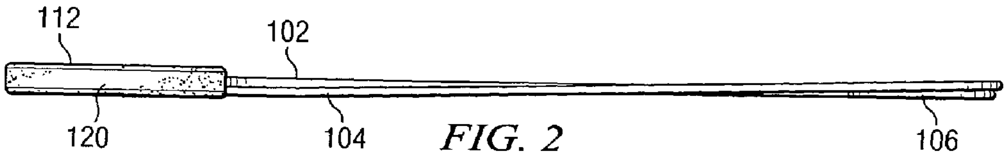
FIG. 2 is a diagram of a side view of the apparatus.

FIG. 2 is a diagram of a side view of apparatus 100. First support member 102, third support member 104 and spring 106 are shown, as well as second support member 112 and support material 120.

Figure 3:
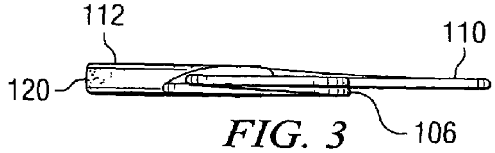
FIG. 3 is a diagram of a rear view of the apparatus showing spring, a support member and a second support member covered by support material.

FIG. 3 is a diagram of a rear view of apparatus 100 showing spring 106, guide 110 and second support member 112 covered by support material 120.

Figure 4:
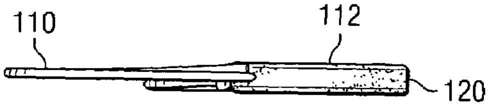
FIG. 4 is a diagram of a front view of the apparatus showing a support member and second support member covered by support material.

FIG. 4 is a diagram of a front view of apparatus 100 showing guide 110 and second support member 112 covered by support material 120.

Figure 5:
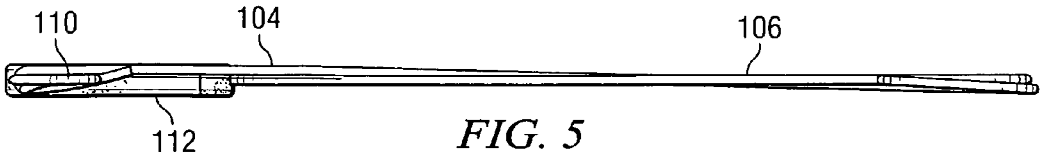
FIG. 5 is a diagram of a side view of the apparatus showing support members, a spring, and a support member covered by a support material.

FIG. 5 is a diagram of a side view of apparatus 100 showing first support member 102, third support member 104, spring 106, guide 110 and second support member 112 covered by support material 120.

Figure 6:
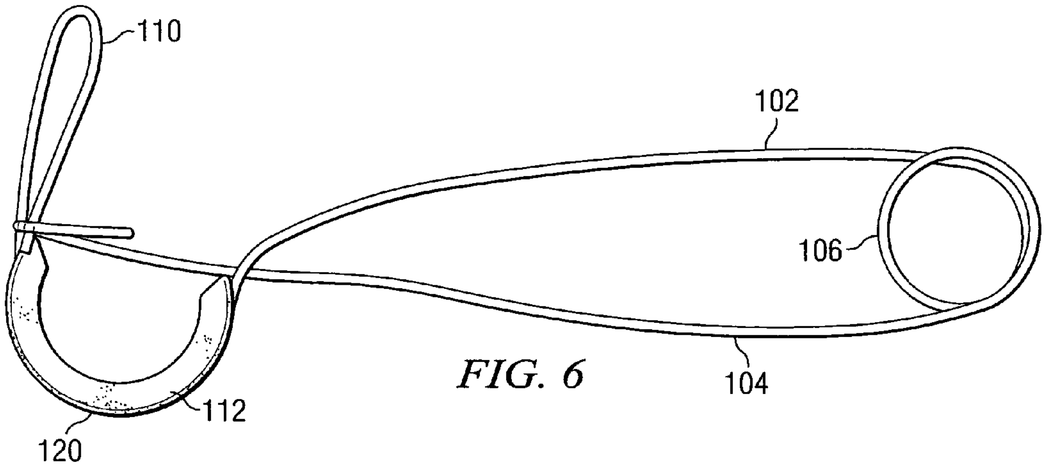
FIG. 6 is a diagram of a bottom view of the apparatus showing support members, a spring, and a support member covered by a support material.

FIG. 6 is a diagram of a bottom view of apparatus 100 showing first support member 102, third support member 104, spring 106, guide 110 and second support member 112 covered by support material 120.

Figure 7:
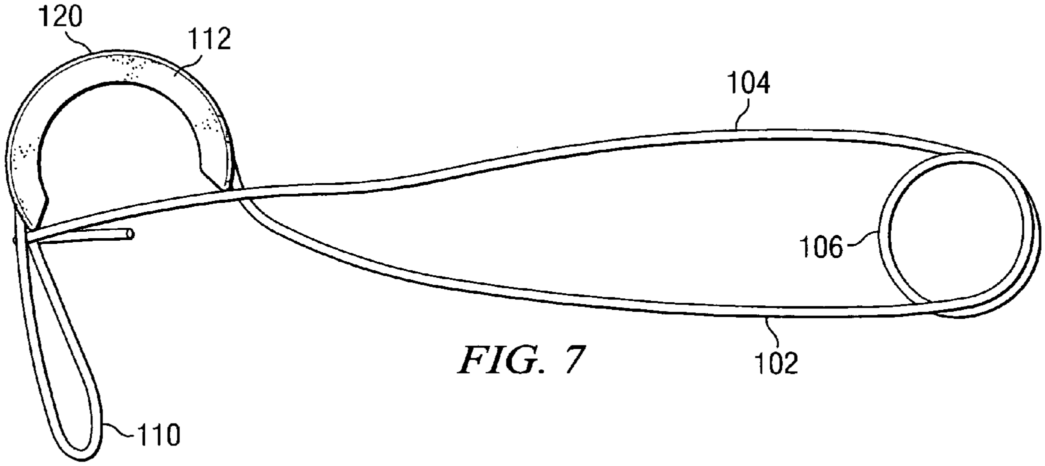
FIG. 7 is a diagram of a reverse view of an apparatus showing support members, a spring, and a support member covered by support material.

FIG. 7 is a diagram of a reverse view of apparatus 100 showing first support member 102, third support member 104, spring 106, guide 110 and second support member 112 covered by support material 120.

Although exemplary embodiments of a system and method of the present invention have been described in detail herein, those skilled in the art will also recognize that various substitutions and modifications can be made to the systems and methods without departing from the scope and spirit of the appended claims.

What is claimed is:

1. An apparatus for holding a crucible or other item comprising:

a first support member having a straight portion with two ends;

a second support member having a shaped portion coupled to one of the ends of the first support member, wherein the shape of the shaped portion accommodates the crucible or other item;

a support material covering the second support member, the support material having a coefficient of compression, wherein the support material increases the coefficient of friction between the crucible or other item and the second support member;

a spring coupled to the other end of the first support member;

a third support member coupled to the spring and configured so as to apply a force to the crucible or other item when the crucible or other item is placed in the shaped portion of the second support member, wherein the third support member can be moved by exerting a force opposite to that applied by the spring so as to allow the crucible or other item to be placed in the shaped portion of the second support member, and wherein the force applied by the spring is coordinated with the coefficient of compression of the support material and the material strength of the crucible or other item so as to decrease the risk of slippage and to decrease the risk of breakage of the crucible or other item.

2. The apparatus of claim 1 wherein the support material is a heat-resistant polymer.

3. The apparatus of claim 1 further comprising a guide coupled to second support member, wherein the third support member is coupled to the guide so as to limit the range of motion of the third support member.

4. The apparatus of claim 1 wherein the first support member, the second support member, the third support member and the spring are made from a single, continuous length of metal.

5. The apparatus of claim 1 wherein the support material covers the third support member where the third support member contacts the crucible or other item.

6. The apparatus of claim 1 wherein the second support member having the shaped portion coupled to one of the ends of the first support member and the support material can be modified by the user to accommodate different shapes of the crucible or other items.

7. The apparatus of claim 1 wherein the second support member having the shaped portion coupled to one of the ends of the first support member and the support material can be removed and replaced with a different second support member to accommodate different shapes of the crucible or other items.

8. A method for handling a crucible or other item comprising:

applying a force to a first support member to counteract a spring force, so as to cause the first support member to move in a first direction;

placing a second support member having a support material in contact with the crucible or other item;

removing the force from the first support member so as to allow the spring force to move the first support member in a direction opposite to the first direction so as to apply the spring force to the crucible or other item;

wherein the spring force is coordinated with a coefficient of compression of the support material so as to prevent the crucible or other item from being damaged by the first support member.

9. The method of claim 8 further comprising adapting the shape of the second support member and the support material to match the shape of the crucible or other item.

10. The method of claim 8 further comprising removing the second support member having the shaped portion coupled to one of the ends of the first support member and the support material and replacing it with a different second support member to accommodate different shapes of the crucible or other items.

* * * * *